United States Patent [19]

Kubo et al.

[11] Patent Number: 4,955,695
[45] Date of Patent: Sep. 11, 1990

[54] LIQUID CRYSTAL DISPLAY DEVICE

[75] Inventors: Kiichiro Kubo; Masamichi Moryia, both of Mobara, Japan

[73] Assignee: Hitachi, Ltd., Tokyo, Japan

[21] Appl. No.: 274,906

[22] Filed: Nov. 22, 1988

[30] Foreign Application Priority Data

Dec. 2, 1987 [JP] Japan .................................. 62-303106

[51] Int. Cl.$^5$ ............................................... G02F 1/13
[52] U.S. Cl. ..................................... 350/331 R; 357/80
[58] Field of Search ............... 357/80, 68; 350/331 R, 350/332, 334

[56] References Cited

U.S. PATENT DOCUMENTS 4,145,120 3/1979 Kubota ................................. 350/332
4,283,118 8/1981 Inoue .................................... 350/334
4,643,526 2/1987 Watanable et al. ................. 350/332
4,826,297 5/1989 Kubo et al. ..................... 350/331 R Primary Examiner—James W. Davie
Attorney, Agent, or Firm—Antonelli, Terry, Stout & Kraus

[57] ABSTRACT

Disclosed is a liquid crystal display device having on one of the two substrates sections for mounting an electronic part thereon. The sections include solder-receiving sections where the terminals of the electronic part to be mounted are soldered to the substrate and wiring for connecting the solder-receving sections to the other sections of the substrate. The wiring includes short necks situated between the solder-receiving sections and the rest of the wiring and having a width which is less than that of the rest of the wiring and the diameter of the solder-receiving sections.

6 Claims, 4 Drawing Sheets

LIQUID CRYSTAL DISPLAY DEVICE

BACKGROUND OF THE INVENTION

The present invention relates to a liquid crystal display device, and more particularly, to a liquid crystal display device in which solder dams can be formed with exceptional ease. Solder dams are required to be formed when mounting an electronic part such as an LSI chip for driving a liquid crystal display device on one of the two glass substrates of a liquid crystal cell, to prevent molten solder for connecting the electronic part to the circuit wiring from flowing beyond a desired area along the wiring sections.

A liquid crystal display device in which an electronic part such as an LSI chip for driving electrodes is mounted on one of the two glass substrates of the liquid crystal cell thereof has recently come to be used widely.

In recent years, "Chip-on-Glass" technology has been studied in order to reduce the size of display devices, to increase display content, and to improve reliability as described in "Chip-on-Glass Technology for Large Scale Automotive Displays", Electronic Displays and Information Systems, SP-565, International Congress & Exposition, Detroit, Michigan, Feb. 27-- Mar. 2, '84. Through chip-on-glass technology, integrated circuits are bonded in chip form directly onto a glass substrate of liquid crystal display device, for example, as described in U.S. Pat. Nos. 4,145,120 and 4,283,118.

In the case of such liquid crystal devices, it is normal practice to form solder bumps of a certain amount of solder on the connecting terminals (bonding pads) of electronic parts. Solder-receiving sections are provided beforehand on the wiring side of the glass substrate, at positions corresponding to those of the above bumps, i.e., the terminals on the electronic part. When performing the mounting operation, the solder bumps on the bonding pads of the electronic part are registered with the corresponding solder-receiving sections on the substrate. The solder is then melted by heating it by the reflow method or a similar method, and is allowed to harden, thus providing electrical connection and mechanical bonding and support.

In the above mounting operation through soldering, it is necessary that the solder of the bumps hardens after it has been sufficiently wetted and stuck to the the metal surface of the solder-receiving sections. If molten solder of bumps is allowed to flow freely over the clean wiring surface of the substate (while the wiring of liquid crystal display devices may be made of either transparent conductive films or metal films, in practice the latter is almost always adopted for those on which electronic parts are to be mounted), the height of the solder bumps is decreased. In such cases, the way the solder flows is different in different parts (depending on the width of the metal film wiring or on whether the solder-receiving section is almost directly connected to a transparent conductive film wiring, etc. As a result, the shape and height of the solder bumps, which were the same everywhere at first, become different in different parts, resulting in an uneven condition of the soldering between the electronic part and the wiring on the substrate. Electrical connection or mechanical support to be obtained through soldering can consequently become inadequate at some soldering positions.

In this context, Japanese Patent Laid-Open No. 252534/1986 (Japanese Patent Application No. 93670/1985), conceived by one of the inventors of the present invention, et al., proposes the formation of solder flow stoppers (solder dams) which consist of photosensitive polyimide resin films formed through photolithography, over the wiring surface. It is true that this prevents the solder from freely flowing along the wiring when performing soldering, allowing the soldering to be effected reliably at a plurality of positions. However, it involves an increase in the number of production processes as well as higher cost.

SUMMARY OF THE INVENTION

In view of the above, the present invention aims at overcoming the problem of the increased number of production processes in the conventional method of forming solder dams and at providing a liquid crystal display device in which solder dams can be formed without augmenting the number of production processes thereof.

This invention provides a liquid crystal display device of the type having on one of the two substrates of the liquid crystal cell thereof circuit wiring for mounting an electronic part thereon. In accordance with this invention, this circuit wiring, which has been arranged on the above substrate surface in a pattern corresponding to the solder bumps formed on the connecting terminals of the electronic part to be mounted, includes necks which are situated between the solder-receiving sections and the rest of the wiring sections. The width of these necks is less than that of the rest of the wiring sections or the diameter of the solder-receiving sections.

In the above construction, the amount of solder flowing over the wiring is limited because of the presence of the necks, which are narrower than the rest of the wiring sections. As a result, the heating of the solder can be terminated and the hardening thereof can start before any substantial amount of solder has flowed over the wiring, so that almost no variances in the height of the solder bumps occur during soldering. In other words, almost no deformation of the solder is observed after hardening.

In accordance with this invention, these solder dams are provided in all those sections where the solder-receiving sections and the wiring sections are to be connected to each other. The height of the solder bumps in all the solder-receiving sections is not affected by any difference in width of the wiring sections on the substrate (For example, a wiring section to a power supply is relatively wide as compared with others), i.e., no changes in the height of the solder bumps are to be observed at any of the different positions, after the soldering. As a result, the distance between an electronic part such as an LSI chip and the glass substrate of a liquid crystal cell, its parallelism, etc. can easily be set to a desired value, thus making it possible to solder with high reliability all the connecting terminals of an electronic part to the wiring on the substrate of a liquid crystal display device.

In addition, in acordance with this invention, all the necessary solder dams can be arranged when designing the pattern of arrangement of the electrodes and wiring on the substrate of a liquid crystal cell, so that the electrodes, the wiring, etc. of a liquid crystal display device can be made of a transparent conductive film or a metal film only, and the formation of a polyimide resin film, which is a requisite process in the production of the above-mentioned conventional liquid crystal display device, is no longer necessary.

DETAILED DESCRIPTION OF THE PREFERRED EMBODIMENTS

An embodiment of this invention will now be described in detail, with reference to the attached drawings.

Figure 1:
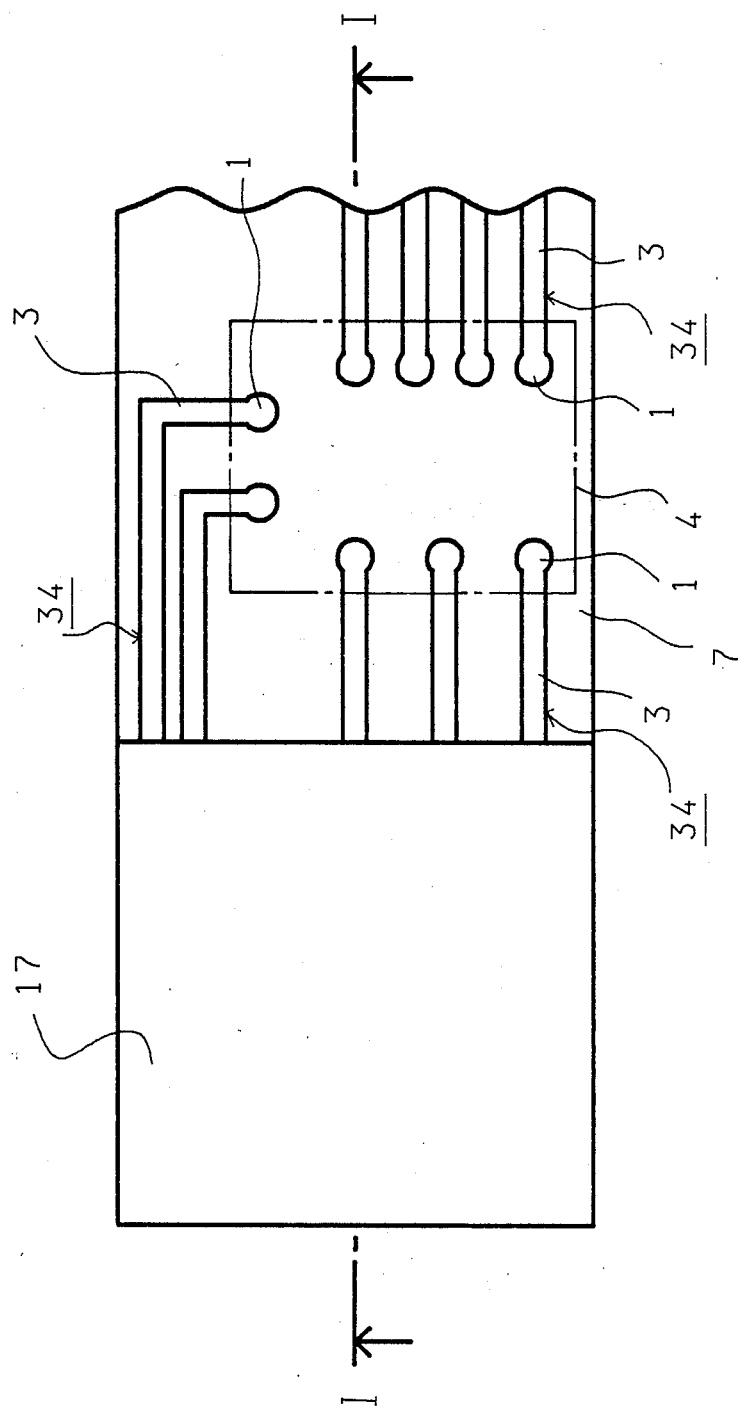
FIG. 1 is a top view of a conventional liquid crystal display device having no solder dams, with an LSI chip and solder removed from soldering sections.
Figure 2:
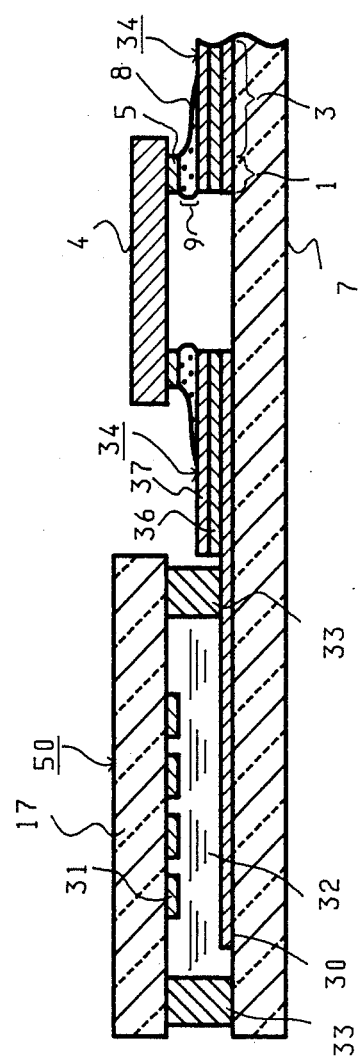
FIG. 2 is a sectional view taken along line I—I of FIG. 1.

FIGS. 1 and 2 illustrate for reference a liquid crystal display device in which no solder dams are formed. FIG. is a top view thereof, with an LSI chip and solder omitted for convenience of illustration. FIG. 2 is a sectional view of the same, taken along line I—I of FIG. 1. This liquid crystal display device includes a lower electrode substrate 7 made of glass and an upper electrode substate 17 made of glass on the inner surfaces of which transparent electrodes 30, 31 made of ITO (indium-tin oxide) are formed. Provided between these upper and lower electrode substrates 17, 7 is a liquid crystal 32, which is sealed in with a surrounding sealing agent 33, thus forming a liquid crystal cell 50. Formed on the lower electrode substrate 7 is a thin multilayer metallic film wiring 34 which is composed of a plated Ni layer 36 having substantial wettability with solder and a plated Au layer 37 for preventing oxidization. An LSI chip 4 is fixed and connected to the thin mulitlayer metallic film wiring 34 by solder (80% Pb+20% Sn). The liquid crystal display device further includes solder-receiving section 1 having a radius of ca. 140 μm, wiring sections 3 having a width of ca. 100 μm, bonding pads 5 on the LSI side, and solder bumps 9. In the case of such a liquid crystal display device having no solder dams, the solder 8 of the bumps 9 when melted is apt to flow toward the wiring sections 3. As described above, the flow amount of solder is different at different positions, generally resulting in excessive variation in the deformation of the solder bumps 9. The connection between the wiring on the substrate and the electronic part concerned consequently lacks its reliability.

Figure 3:
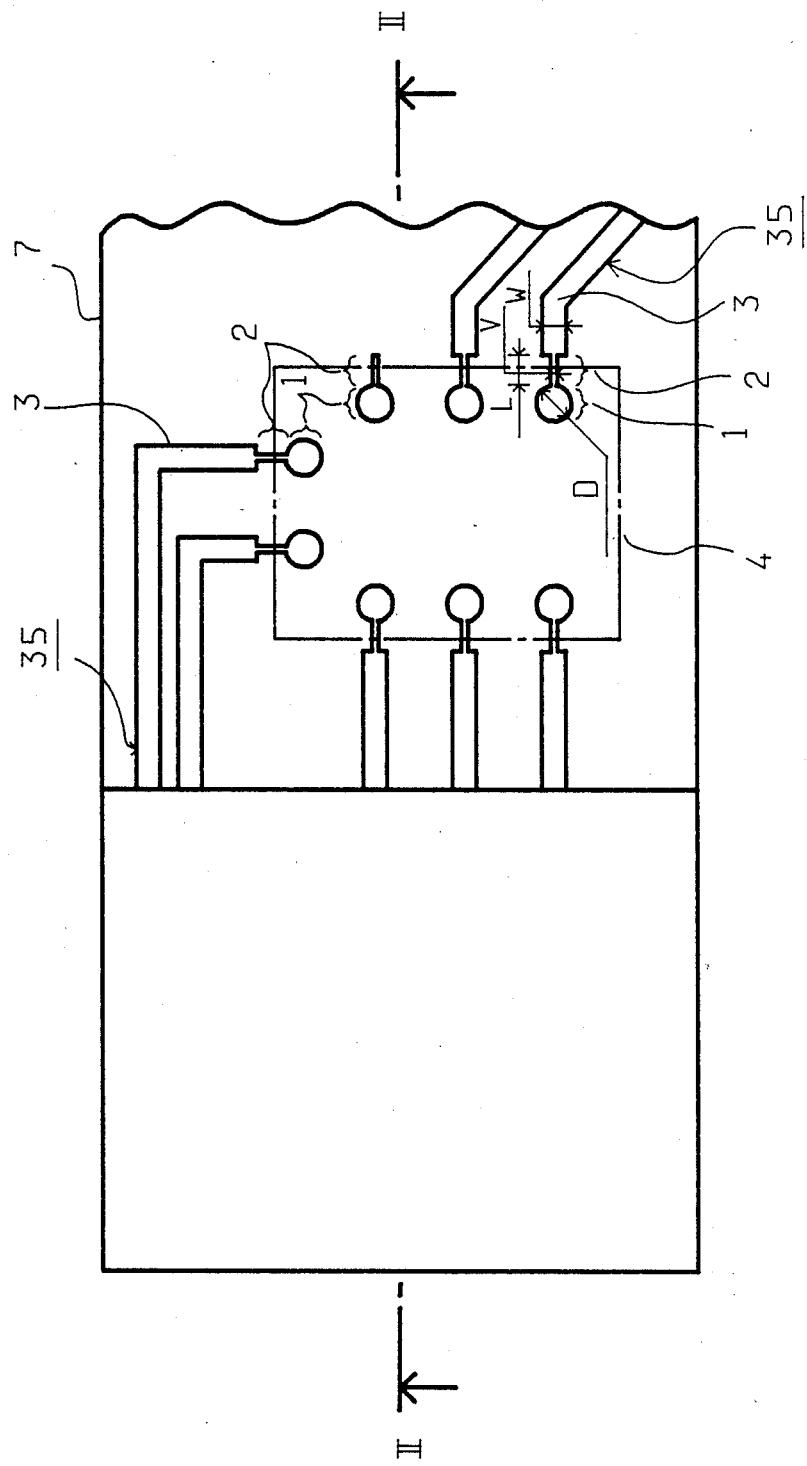
FIG. 3 is a top view of an embodiment of this invention, with the essential parts enlarged and an LSI chip and solder removed from soldering sections.
Figure 4:
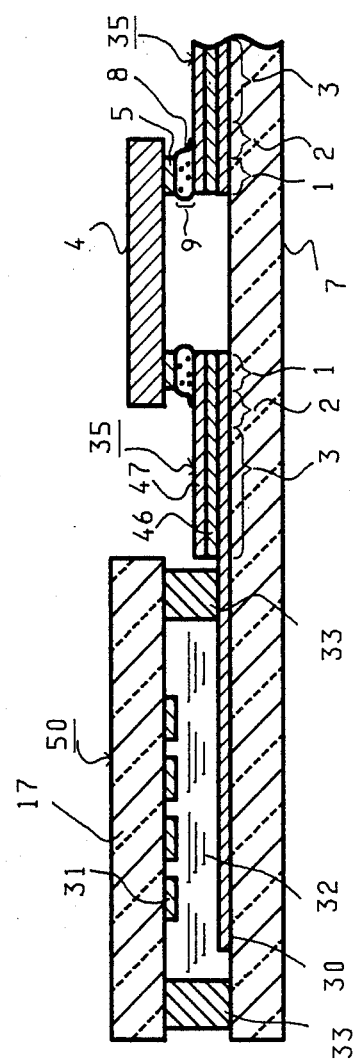
FIG. 4 is a sectional view taken along line II—II of FIG. 3.

FIG. 3 is a top view showing an embodiment of the present invention, with the essential parts enlarged and with an LSI schip and solder removed, and FIG. 4 is a sectional view thereof, taken along line II—II of FIG.3. Formed on the lower electrode substrate 7 of this embodiment is a transparent electrode 30 which is formed from ITO. A thin multilayer metallic film wiring 35 composed of a plated Ni layer 46 and a plated Au layer 47 is formed on the electrode 30. The embodiment further includes solder-receiving sections 1, solder dams 2, wiring sections 3, an LSI chip 4, bonding pads 5 on the LSI side, solder 8 (80% Pb+20% Sn), and solder bump sections 9.

The solder-receiving section 1 have a diameter D of 140 μm, and the wiring sections of the thin multilayer metallic film wiring 35 have a width of 100 μm. Provided between the solder-receiving sections 1 and the wiring sections 3 are necks 2 having a width V of 30 μm and a length L of 100 μm. If in this embodiment the molten solder 8 begins to flow during the soldering operation, the flow amount thereof is limited because of the presence of the necks 2 which constitute the solder dams. In other words the flow of the solder 8 is stopped by the solder dams, so that the solder bumps 9 undergo little deformation.

The size of the solder dams, i.e. the necks 2 formed between the solder-receiving sections 1 and the wiring sections 3 is not to be construed as restricted to the one mentioned above. The deformation and the variation in height of the solder bumps 9 can be kept within an acceptable range for practical use if the width V of the neck 2 ranges from 20 to 70 μm, preferably from 30 to 50 μm, and the length L from 100 to 150 μm.

As described above, the solder dams in accordance with this invention can be formed without forming a protective film for defining a path for molten solder to flow over the metallic film wiring. In addition, the solder dams in accordance with this invention practically constitute part of the wiring, so that they can be formed fittingly to the design in terms of position and configuration in the process of forming the wiring on the substrate of a liquid crystal cell. This is not the case with the above conventional method where a protective film for solder dams is formed in a separate process. Then the dams cannot always be registered with the wiring properly.

What is claimed is:

1. A liquid crystal display device including two substrates which contain a liquid crystal therebetween, said liquid crystal display device further including:
   means disposed on at least one of said two substrates for mounting an electronic part thereon, said mounting means comprising a plurality of solder-receiving sections where at least one terminal of said electronic part is soldered to said at least one substrate and wiring for connecting said plurality of solder-receiving sections to additional portions of said at least one substrate, wherein necks of a predetermined length are provided in said wiring at positions between said plurality of solder-receiving sections and a remaining portion of said wiring, said necks having a width which is less than that of said remaining portion of said wiring and which is less than a diameter of said solder-receiving sections.

2. A liquid crystal display device as claimed in claim 1, wherein the width of said necks ranges from 20 to 70 μm.

3. A liquid crystal display device as claimed in claim 2, wherein the width of said necks ranges from 30 to 50 μm.

4. A liquid crystal display device as claimed in claim 2, wherein the length of said necks ranges from 100 to 150 μm.

5. A liquid crystal display device as claimed in claim 1, wherein the uppermost layer of said solder-receiving sections is formed of Au and the layer immediately under said uppermost layer is formed of Ni.

6. A liquid crystal display device according to Claim 1, wherein said necks of a predetermined length enable the prevention of molten solder from freely flowing from said plurality of solder-receiving sections into said remaining portion of said wiring.

* * * * *